(12) United States Patent
Priel et al.

(10) Patent No.: US 7,548,093 B1
(45) Date of Patent: Jun. 16, 2009

(54) SCHEME OF LEVEL SHIFTER CELL

(75) Inventors: Michael Priel, Herzlya (IL); Dan Kuzmin, Givat Shmuel (IL); Anton Rozen, Gedera (IL)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/042,351

(22) Filed: Mar. 5, 2008

(51) Int. Cl.
*H03K 19/0175* (2006.01)

(52) U.S. Cl. .......................................... 326/63; 326/81

(58) Field of Classification Search ............. 326/63–68, 326/80–87
See application file for complete search history.

(56) References Cited

U.S. PATENT DOCUMENTS

| | | | | |
|---|---|---|---|---|
| 5,438,542 A | * | 8/1995 | Atsumi et al. ............... | 365/182 |
| 5,668,758 A | * | 9/1997 | Yiu et al. ................ | 365/185.23 |
| 6,163,179 A | * | 12/2000 | Huang et al. ................. | 327/108 |
| 6,469,542 B2 | * | 10/2002 | Manning ...................... | 326/81 |
| 2008/0094105 A1 | * | 4/2008 | Santurkar et al. ............. | 326/68 |

* cited by examiner

*Primary Examiner*—Don P Le

(57) ABSTRACT

A system having voltage level shifting capabilities, the system includes a logic circuit and a multiple level voltage supply circuit; wherein the logic circuit comprises at least one PMOS transistor and at least one NMOS transistor; wherein the logic circuit receives an input signal, receives a voltage supply signal from the multiple level voltage supply circuit, and outputs an output signal via a first node; wherein the input signal has a low voltage swing between a low level supply voltage and a rail voltage; wherein the output signal has a high voltage swing between a high level supply voltage and the rail voltage; and wherein the multiple level voltage supply circuit selects, in response to a level of the output signal, whether to provide to the supply node of the logic circuit a high level supply voltage or a low level supply voltage.

10 Claims, 5 Drawing Sheets

SCHEME OF LEVEL SHIFTER CELL

FIELD OF THE INVENTION

The present invention relates to a system that has voltage level shifting capabilities and a method for voltage level shifting.

BACKGROUND OF THE INVENTION

A modern integrated circuit can include multiple power domains that receive different supply signals. Multiple level shifting circuits are located at the boundaries between different power domains and are connected to inputs/outputs of logic circuits that are positioned near these boarders.

Prior art level shifters are slow and introduce delay as a high to low switch or a low to high switch involves passing through a conjunction state, when both NMOS and PMOS transistors in same current path are in some conduction mode. This is a very critical for today's designs, where clock cycle time is comparable to delay of several "digital" cells.

SUMMARY OF THE PRESENT INVENTION

The present invention provides a method and a system as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION OF PREFERRED EMBODIMENTS

Although the invention is described herein with reference to specific embodiments, various modifications and changes can be made without departing from the scope of the present invention as set forth in the claims below.

An efficient voltage level conversion can be based upon the following assumptions: (i) complementary MOS (CMOS) transistors (such as at least one PMOS transistor and at least one NMOS transistor) are included in a logic circuit and especially at its output stage; (ii) a low level output signal (also referred to as '0', ground, substantially zero volts or a reference voltage, rail voltage) can be outputted by the logic circuit when the NMOS transistor is in a conductive mode and the PMOS transistor is in a non conductive mode, and this can occur (relatively quickly) by providing a high voltage level (for example of about a low level supply voltage or about a high level supply voltage) to the gates of the PMOS transistor and the NMOS transistor; and (iii) a high level output signal can be provided when the NMOS transistor is non conductive, the PMOS transistor is conductive and its source node receives a supply voltage, wherein this can occur by providing a low level signal to the gates of the PMOS transistor and the NMOS transistor.

Faster level shifting operation can be achieved by switching the supply voltage provided to the logic circuit (between a high level supply voltage and a low level supply voltage, without any additional level-shifter cells, connected serially to the functional signal net) and especially by using a multiple level voltage supply circuit that quickly responds to the raising of an output signal of the logic circuit.

Figure 1:
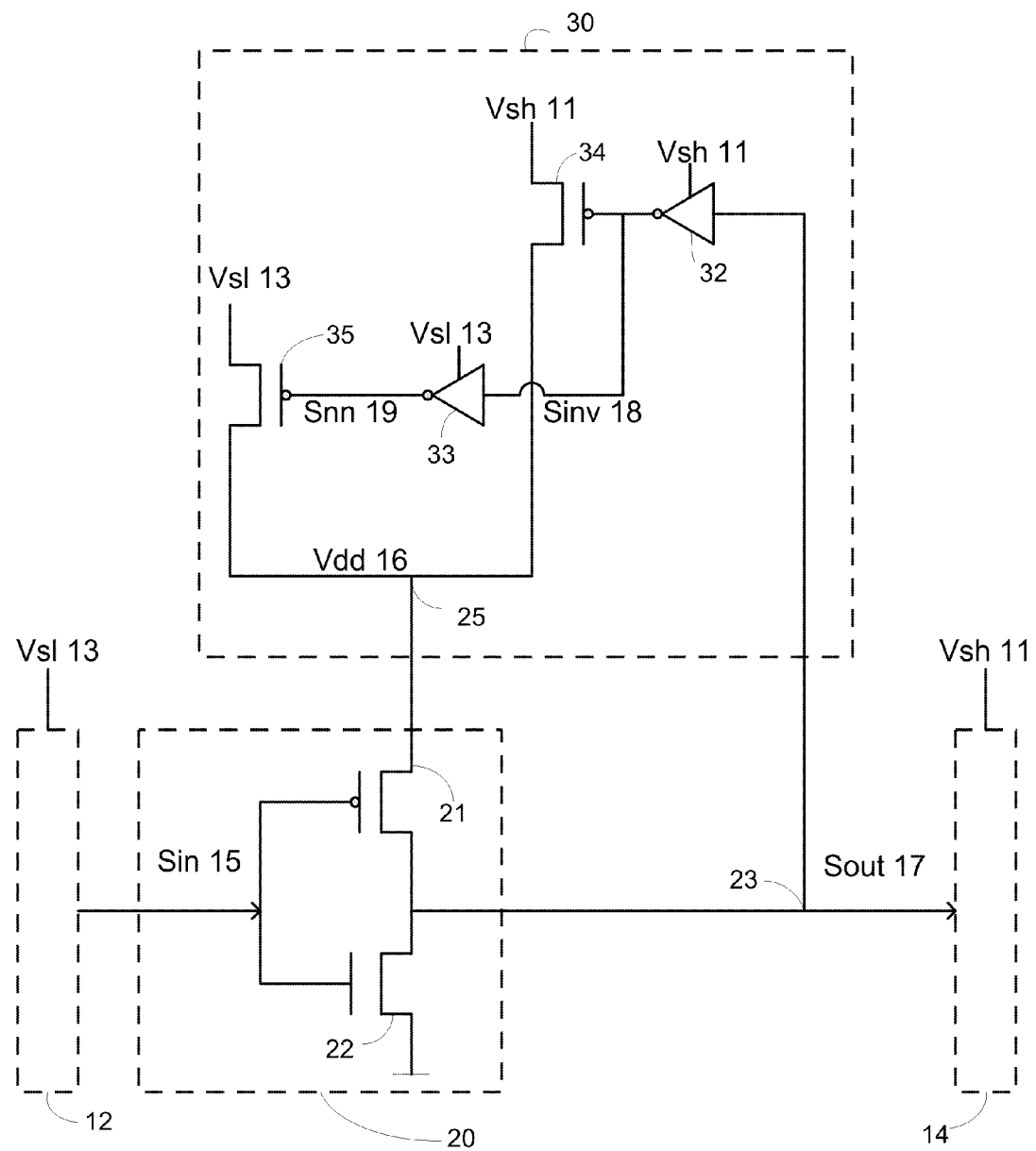
FIG. 1 illustrates an example of an embodiment of a system having level shifting capabilities.

FIG. 1 illustrates an example of an embodiment of system 10 that has level shifting capabilities.

System 10 can include one or more integrated circuits and can a mobile phone, a media player, a lap top computer, a desktop computer and the like.

It is noted that the rail voltage (also referred to as reference voltage) can be the lowest voltage level that is supplied to logic circuit 20. The rail voltage can equal zero (and in this case the rail voltage terminals can be referred to as ground terminals) but this is not necessarily so. The rail voltage can be positive or negative.

System 10 includes multiple power domains. For simplicity of explanation, FIG. 1 illustrates power domains 12 and 14 as being connected to logic circuit 20. Power domain 12 can include multiple circuits and power domain 14 can include multiple circuits. An output signal of power domain 12 is the input signal (Sin 15) of logic circuit 20 while the output signal (Sout 17) of logic circuit 20 is an input signal of power domain 14.

Power domain 12 is fed by low level supply voltage Vsl 13 while power domain 14 is fed by high level supply voltage Vsh 11.

Figure 2:
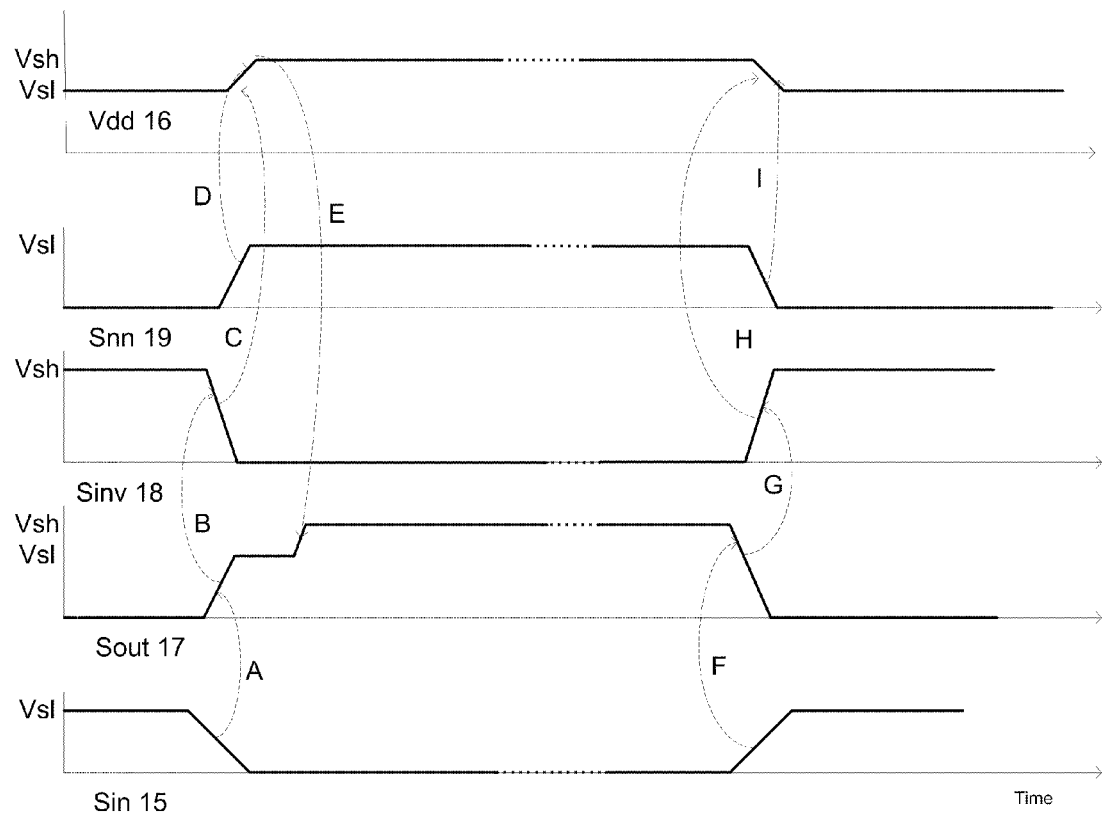
FIG. 2 illustrates an example of multiple signals of a system having level shifting capabilities.
Figure 3:
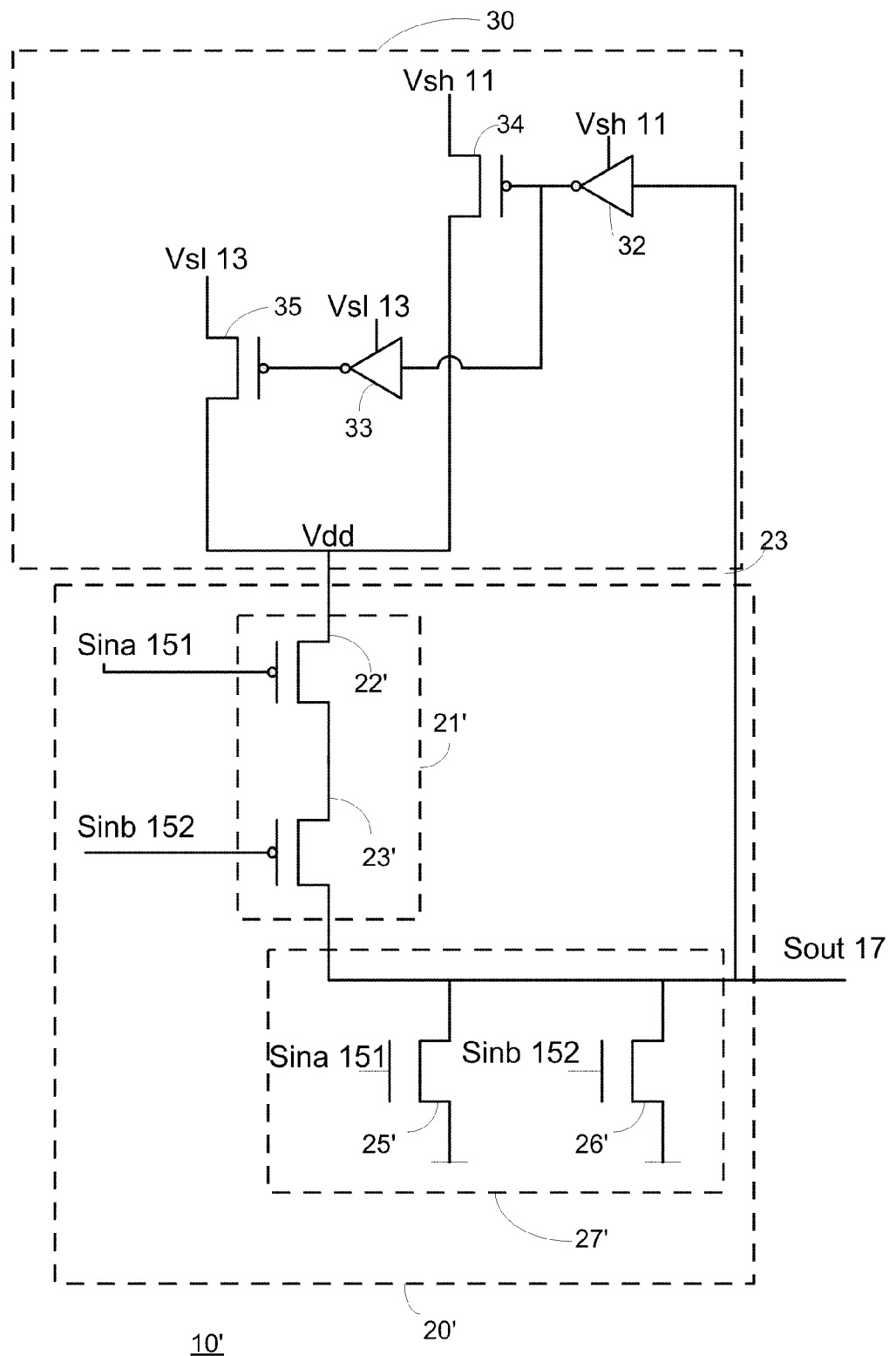
FIG. 3 illustrates an example of an embodiment of a system having level shifting capabilities.

FIG. 1 illustrates logic circuit 10 as being an inverter although other CMOS cells or circuits can be included in logic circuit 20. Logic circuit 20 can have multiple input nodes and additionally or alternatively multiple output nodes. Typically, there are more input nodes than output nodes. For example, FIG. 2 illustrates logic circuit 20' as including a NOR gate while FIG. 3 illustrates logic circuit 20" as including a NAND gate.

Logic circuit 20 is connected to multiple level voltage supply circuit 30 at first node 23 and second node 25. First node 23 is an output node of logic circuit 20 and an input node of multiple level voltage supply circuit 30. Second node 25 is a voltage supply node of logic circuit 20 and an output node of multiple level voltage supply circuit 30.

Logic circuit 20 includes PMOS transistor 21 and NMOS transistor 22 that form an inverter.

Logic circuit 20 receives input signal Sin 15, receives voltage supply signal Vdd 16 from multiple level voltage supply circuit 30, and outputs output signal Sout 17 via first node 23.

Input signal Sin 15 has a low voltage swing between low level supply voltage Vsl 13 and the rail voltage. Output signal Sout 17 has a high voltage swing between high level supply voltage Vsh 11 and the rail voltage.

Multiple level voltage supply circuit 30 selects, in response to a level of output signal Sout 17, whether to provide to PMOS transistor 21 (via second node 25) a supply voltage signal (Vdd 16) that is a high level supply voltage or a low level supply voltage.

Conveniently, multiple level voltage supply circuit 30 provides the high level supply voltage Vsh 11 (Vdd=Vsh) if the level of output signal Sout 17 is low and provides low level supply voltage Vsl 13 (Vdd=Vsl) if the level of the output signal Sout 17 is high.

Multiple level voltage supply circuit 30 can include an input node 23, first inverter 32, second inverter 33, first PMOS transistor 34 and second PMOS transistor 35. Input node 23 receives output signal Sout 17. First inverter 32 inverts output signal Sout 17 to provide first inverted signal Sinv 18. Sinv 18 is provided to a gate of first PMOS transistor 34 and to second inverter 33. Second inverter 33 inverts first inverted signal Sinv 18 to provide non inverted signal Snn 19. Snn 19 is provided to a gate of second PMOS transistor 35. The source of first PMOS inverter 34 receives high level supply voltage Vsh 11, the source of second PMOS transistor 35 receives low level supply voltage Vsl 13, and the drains of the first and second PMOS transistors 34 and 35 are coupled to second node 25 to provide voltage supply signal Vdd 16.

Second inverter 33 can include an NMOS transistor that is more dominant than a PMOS transistor of the second inverter 33. This feature assists in managing the different voltage supply voltages that are provided to second inverter 33—its drain receives (as a supply voltage signal) Vsl 13 and its gate receives inverted signal Sinv 18 that has a high voltage swing.

First inverter 32 can be characterized by a low switching point. This low switching point speeds up the switching of the output of the first inverter 32 in response to Sout 17.

PMOS 21 can be maintained conductive by receiving a low level input signal (Sin 15) to its gate while receiving a high level supply voltage (Vdd=Vsh) to its source. Power domain 12 can receive Vsl constantly.

In this scenario, NMOS transistor 22 is maintained in non-conductive mode by receiving a low level signal to its gate (and source). This also guarantees that NMOS transistor 22 does not allow high leakage to the rail node.

When PMOS 21 is required to be maintained in a non-conductive mode its source and gate receive Vsl 13 and it also insures low leakage from source to drain.

FIG. 2 illustrates an example of multiple signals of system 10 such as Sin 15, Sout 17, Sinv 18, Snn 19 and Vdd 16.

Initially, Sin 15 is high (equals Vsl 13), Sout 17 is low, Sinv 18 is high (Equals Vsh 11), Snn 19 is low and Vdd 16 equals Vsl 13.

At a certain point of time, Sin 15 performs a high to low transition.

This high to low transition causes Sout 17 to perform a low to high transition (as illustrated by arrow A). Because Vdd 16 still equals Vsl 13 Sout 17 equals Vsl 13.

The low to high transition of Sout 17 causes Sinv 18 to perform a high to low transition (as illustrated by arrow B).

The high to low transition of Sinv 18 causes Snn 19 to perform a low to high transition (as illustrated by arrow C). Snn 19 now equals Vsl 13.

The high to low transition of Sinv 18 causes Vdd 16 to equal Vsh 11, since PMOS transistor 34 is in conductive mode (as illustrated by arrow D). This causes Sout 17 to increase to be equal to Vsh 11 (as illustrated by arrow E).

At another point of time, Sin 15 performs a low to high transition ("high" equals to Vsl 13).

This low to high transition causes Sout 17 to perform a high to low transition (as illustrated by arrow F).

The high to low transition of Sout 17 causes Sinv 18 to perform a low to high transition (as illustrated by arrow G). Sinv 18 now equals Vsh 11.

The low to high transition of Sinv 18 causes Snn 19 to perform a high to low transition (as illustrated by arrow H).

The low to high transition of Sinv 18 causes Vdd 16 to equal Vsl 13 (as illustrated by arrow I.

It is noted that FIG. 2 is out of scale.

FIG. 3 illustrates a logic circuit that is a NOR gate. NOR gate 20' includes two inputs that receive two input signals Sina 151 and Sinb 152, each being provided to a pair of NOR gate NMOS and PMOS transistors. NOR gate 20' also includes circuit 21' and circuit 27'. Circuit 21' includes first NOR gate PMOS transistor 22' and second NOR gate PMOS transistor 23'. A source of first NOR gate PMOS transistor 22' is connected to multiple level voltage supply circuit 30 at second node 25 to receive Vdd 16. The drain of second NOR gate PMOS transistor 23' is connected to first node 23. Circuit 27' includes NOR gate NMOS transistors 25' and 26' that are connected in parallel to each other. Multiple level voltage supply circuit 30 selects, in response to the level of output signal Sout 17, whether to provide to circuit 21' the high level supply voltage or the low level supply voltage.

Figure 4:
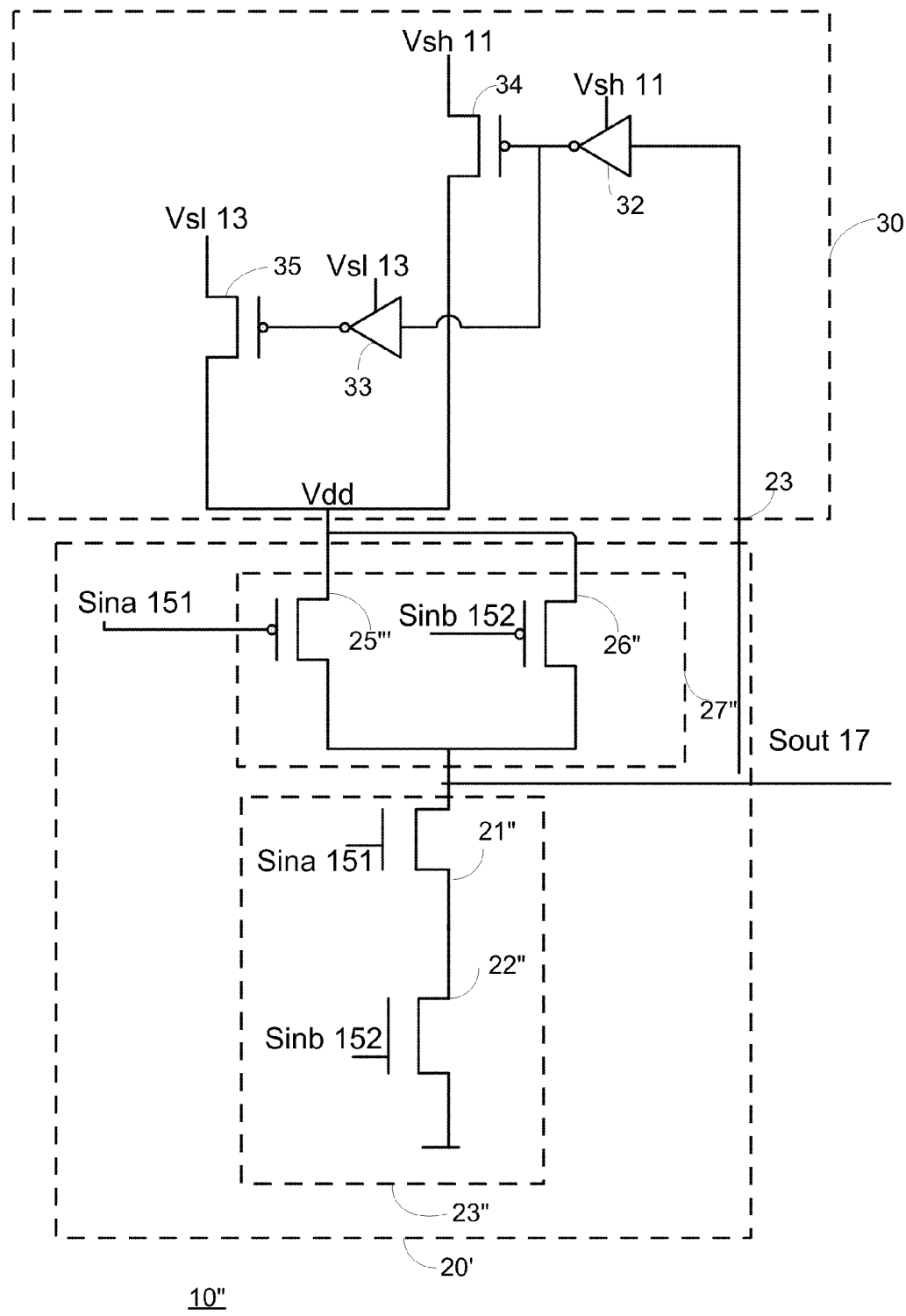
FIG. 4 illustrates an example of an embodiment of a system having level shifting capabilities.

FIG. 4 illustrates logic circuit 20" that is a NAND gate. NAND gate 20" includes circuit 23" and circuit 27". Circuit 23" includes first NAND gate NMOS transistor 21" and second NAND gate NMOS transistor 22". A drain of first NAND gate NMOS 21" circuit is connected to first node 23 and a source of second NAND gate NMOS transistor 22" is connected to a rail node. Circuit 27" includes NAND gate PMOS transistors 25" and 26" that are connected in parallel to each other. Multiple level voltage supply circuit 30 selects, in response to the level of output signal Sout 17, whether to provide to circuit 27" the high level supply voltage or the low level supply voltage.

Figure 5:
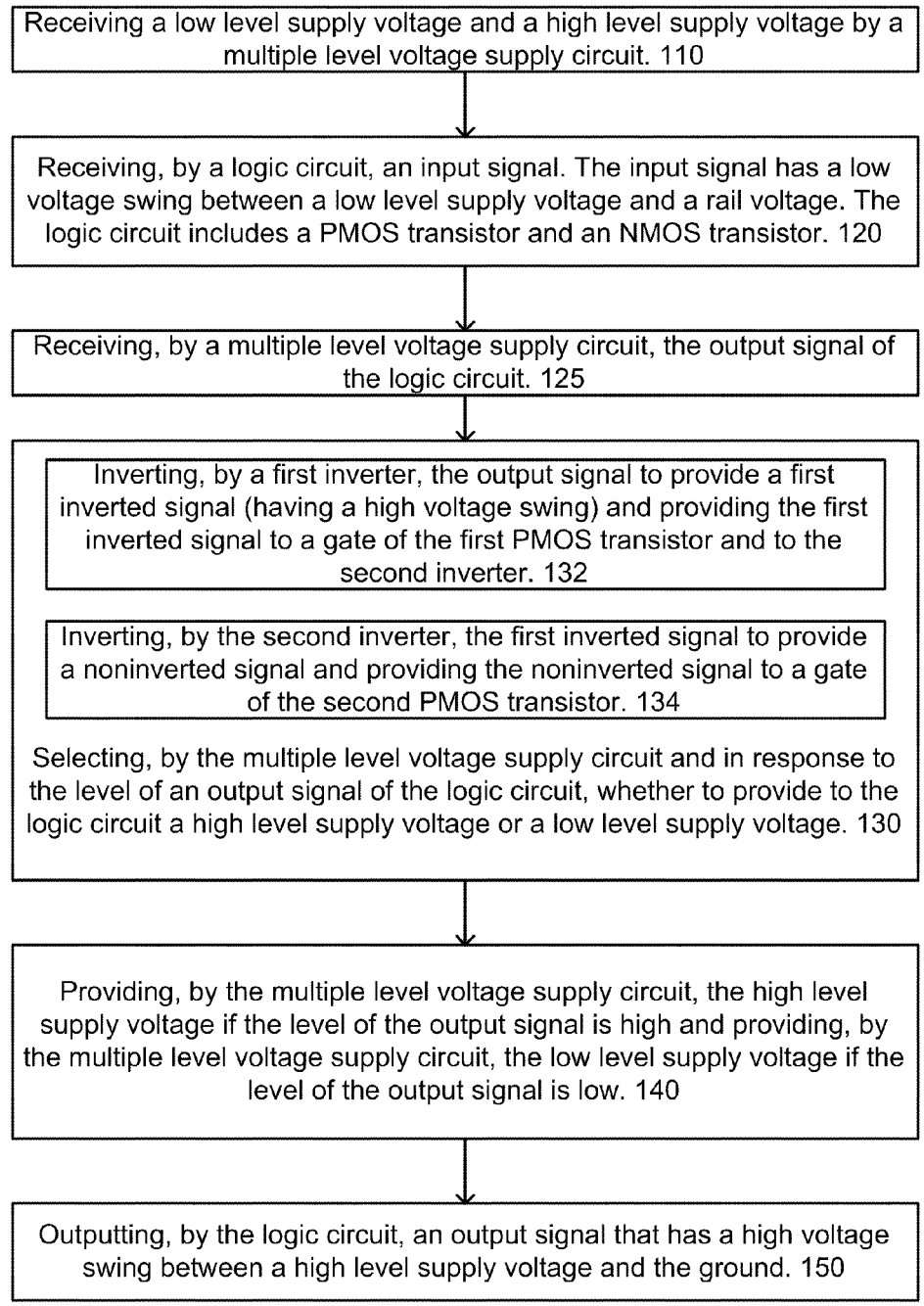
FIG. 5 schematically shows an example of an embodiment of a method for level shifting.

FIG. 5 schematically shows an example of an embodiment of method 100 for level shifting according to an embodiment of the invention.

Method 100 for level shifting starts by stage 110 of receiving a low level supply voltage and a high level supply voltage by a multiple level voltage supply circuit.

Stage 110 is followed by stage 120 of receiving, by a logic circuit, an input signal. The input signal has a low voltage swing between a low level supply voltage and a rail voltage. The logic circuit includes a PMOS transistor and an NMOS transistor.

Stage 120 is followed by stage 125 of receiving, by a multiple level voltage supply circuit, the output signal of the logic circuit.

Stage 125 is followed by stage 130 of selecting, by the multiple level voltage supply circuit and in response to the level of an output signal of the logic circuit, whether to provide to the PMOS transistor a high level supply voltage or a low level supply voltage.

Stage 130 is followed by stage 140 of providing, by the multiple level voltage supply circuit, the high level supply voltage if the level of the output signal (for example Sout 17) is high and providing, by the multiple level voltage supply circuit, a low level supply voltage if the level of the output signal (for example Sout 17) is low.

Stage 140 is followed by stage 150 of outputting, by the logic circuit, an output signal that has a high voltage swing between a high level supply voltage and the rail voltage.

The multiple level voltage supply circuit can include an input node, a first inverter, a second inverter, a first PMOS transistor, and a second PMOS transistor. The drains of the first and second PMOS transistors are connected to the PMOS transistor. In this case, stage 125 can include receiving the output signal (for example) Sout 17 by an input node of the multiple level voltage supply circuit. Stage 110 can include receiving, by the source of the first PMOS transistor 34 and first inverter 32, the high level supply voltage, and receiving, by the source of the second PMOS transistor 35 and second inverter 33 the low level supply voltage. Stage 130 of selecting can include stage 132 of inverting, by a first inverter, the output signal to provide a first inverted signal (which can have a high voltage swing) and providing the first inverted signal to a gate of the first PMOS transistor and to the input of the second inverter.

Additionally or alternatively, stage 130 can include stage 134 of inverting, by the second inverter, the first inverted signal to provide a non inverted signal (which can have voltage swing between Vsl and the rail voltage) and providing the non inverted signal to a gate of the second PMOS transistor.

Stage 134 can include inverting the inverted signal by a second inverter that includes an NMOS transistor that is more dominant (having higher ratio of width over length) than a PMOS transistor of the second inverter.

Stage 132 can include inverting the output signal by a first inverter that is characterized by a low switching point.

Stage 140 can include maintaining a PMOS transistor of the logic circuit in the conductive mode by providing a low level voltage to the gate of this transistor and by providing high supply voltage to the source of said transistor.

Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

The present invention can be practiced by employing conventional tools, methodology, and components. Accordingly, the details of such tools, component, and methodology are not set forth herein in details. In the previous descriptions, numerous specific details are set forth, in order to provide a thorough understanding of the present invention. However, it should be recognized that the present invention might be practiced without resorting to the details specifically set forth.

Only exemplary embodiments of the present invention and but a few examples of its versatility are shown and described in the present disclosure. It is to be understood that the present invention is capable of use in various other combinations and environments and is capable of changes or modifications within the scope of the inventive concept as expressed herein.

Furthermore, the terms "a" or "an," as used herein, are defined as one as or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

We claim:

1. A system having voltage level shifting capabilities, the system comprises a logic circuit and a multiple level voltage supply circuit;

wherein the logic circuit comprises at least one PMOS transistor and at least one NMOS transistor;

wherein the logic circuit receives an input signal, receives a voltage supply signal from the multiple level voltage supply circuit, and outputs an output signal via a first node;

wherein the input signal has a low voltage swing between a low level supply voltage and a rail voltage;

wherein the output signal has a high voltage swing between a high level supply voltage and the rail voltage;

wherein the multiple level voltage supply circuit selects, in response to a level of the output signal, whether to provide to the supply node of the logic circuit a high level supply voltage or a low level supply voltage.

2. The system according to claim 1 wherein the multiple level voltage supply circuit provides the high level supply voltage if the level of the output signal is high and provides the low level supply voltage if the level of the output signal is low.

3. The system according to claim 1 wherein the multiple level voltage supply circuit comprises a first inverter, a second inverter, a first PMOS transistor and a second PMOS transistor;

wherein the first inverter receives the output signal and inverts the output signal to provide a first inverted signal, the first inverted signal is provided to a gate of the first PMOS transistor and to the second inverter;

wherein the second inverter inverts the first inverted signal to provide a non inverted signal, the non inverted signal is provided to a gate of the second PMOS transistor;

wherein the source of the first PMOS inverter receives the high level supply voltage, the source of the second PMOS inverter receives the low level supply voltage and drains of the first and second PMOS transistors are connected to a second node.

4. The system according to claim 3 wherein the second inverter comprises an NMOS transistor that is more dominant than a PMOS transistor of the second inverter.

5. The system according to claim 3 wherein the first inverter is characterized by a low switching point.

6. A method for voltage level shifting capabilities, the method comprises:

receiving, by a logic circuit that comprises a PMOS transistor and an NMOS transistor, an input signal; wherein the input signal has a low voltage swing between a low level supply voltage and a rail voltage;

selecting, by a multiple level voltage supply circuit and in response to a level of an output signal of the logic circuit, whether to provide to the PMOS transistor a high level supply voltage or a low level supply voltage; and outputting, by the logic circuit, an output signal that has a high voltage swing between a high level supply voltage and the rail voltage.

7. The method according to claim 6 wherein the selecting is followed by providing, by the multiple level voltage supply circuit, the high level supply voltage if the level of the output signal is high and providing, by the multiple level voltage supply circuit, the low level supply voltage if the level of the output signal is low.

8. The method according to claim 6 wherein the multiple level voltage supply circuit comprises an input node, a first inverter, a second inverter, a first PMOS transistor and a second PMOS transistor;

wherein drains of the first and second PMOS transistors are coupled to the PMOS transistor;

wherein the selecting is preceded by receiving the output signal by an input node of the multiple level voltage supply circuit;

wherein the selecting comprises:

inverting, by a first inverter, the output signal to provide a first inverted signal and providing the first inverted signal to a gate of the first PMOS transistor and to the second inverter;

inverting, by the first inverter, the first inverted signal to provide a non inverted signal and providing the non inverted signal to a gate of the second PMOS transistor; and wherein the method comprises receiving, by the source of the first PMOS inverter, the high level supply voltage, and receiving, by the source of the second PMOS inverter the low level supply voltage.

9. The method according to claim 8 wherein the second inverter comprises an NMOS transistor that is more dominant than a PMOS transistor of the second inverter.

10. The method according to claim 8 wherein the first inverter is characterized by a low switching point.

* * * * *